(12) United States Patent
Jacobson et al.

(10) Patent No.: US 7,848,562 B1
(45) Date of Patent: Dec. 7, 2010

(54) METHOD OF REDUCING THE TIME REQUIRED TO PERFORM A PASSIVE VOLTAGE CONTRAST TEST

(75) Inventors: Steven Jacobson, Dublin, CA (US); Duc Huu Nguyen, San Jose, CA (US); William Ng, San Jose, CA (US); Zachary Joshua Gemmill, Mountain View, CA (US); Usharani Bhimavarapu, San Jose, CA (US); Kevin Weaver, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 1472 days.

(21) Appl. No.: 11/235,794

(22) Filed: Sep. 26, 2005

(51) Int. Cl.
*G06K 9/00* (2006.01)
(52) U.S. Cl. .................................................... 382/145
(58) Field of Classification Search ................ 382/141, 382/144–151; 716/4–16; 348/80, 86–87; 702/57–59, 64; 324/751, 765
See application file for complete search history.

(56) References Cited

U.S. PATENT DOCUMENTS

| | | | | |
|---|---|---|---|---|
| 5,600,734 | A * | 2/1997 | Okubo et al. | 382/147 |
| 5,604,819 | A * | 2/1997 | Barnard | 382/151 |
| 5,640,098 | A * | 6/1997 | Niijima et al. | 324/751 |
| 5,825,191 | A * | 10/1998 | Niijima et al. | 324/751 |
| 5,825,912 | A * | 10/1998 | Okubo et al. | 382/145 |
| 5,872,862 | A * | 2/1999 | Okubo et al. | 382/151 |
| 7,272,810 | B2 * | 9/2007 | Orita | 716/10 |
| 7,571,407 | B2 * | 8/2009 | Nishikawa | 716/6 |
| 2005/0160391 | A1 * | 7/2005 | Orita | 716/13 |
| 2006/0241877 | A1 * | 10/2006 | Nishikawa | 702/58 |
| 2008/0024601 | A1 * | 1/2008 | Sato et al. | 348/80 |
| 2010/0070942 | A1 * | 3/2010 | Madurawe | 716/16 |

* cited by examiner

*Primary Examiner*—Sherali Ishrat
(74) *Attorney, Agent, or Firm*—Mark C. Pickering

(57) ABSTRACT

The time required to perform a passive voltage contrast test of an area of interest of a layer of interest is substantially reduced by digitizing a passive voltage contrast image to form contrast data that represents the image, and comparing the contrast data to computer aided design (CAD) data that defines the semiconductor device.

17 Claims, 4 Drawing Sheets

METHOD OF REDUCING THE TIME REQUIRED TO PERFORM A PASSIVE VOLTAGE CONTRAST TEST

BACKGROUND OF THE INVENTION

1. Field of the Invention

The present invention relates to passive voltage contrast tests and, more particularly, to a method of reducing the time required to perform a passive voltage contrast test.

2. Description of the Related Art

A passive voltage contrast test is a test that is commonly performed on semiconductor devices that have failed. The test determines whether any of the circuit nodes in an area of interest of a layer of interest have a grounded or floating electrical state, with respect to a grounded substrate, that is other than expected. In other words, a passive voltage contrast test identifies the circuit nodes which are grounded, but which should be floating, and which are floating, but which should be grounded, thereby identifying any points of failure.

To perform the test, a semiconductor device is lapped down in a conventional fashion to expose a layer, such as a contact/via layer where the exposed contacts/vias of the layer represent the circuit nodes, or a metal layer where the exposed metal regions of the layer represent the circuit nodes. For example, a passive voltage contrast test can be performed on a via layer or a metal layer where all of the overlying layers have been removed, or a contact layer where all of the layers down to and including the metal-1 layer have been removed.

After the die has been lapped down, the die is imaged using, for example, a focused ion beam (FIB) system or a scanning electron microscope (SEM) system. In a SEM system, the substrate of the die is placed on a grounded stub, and scanned with an electron beam. The scanning electron beam electrically charges the non-grounded circuit nodes which, in turn, allow a passive voltage contrast image of the area of interest of the layer of interest to be generated. In the image, nodes that are tied to the substrate typically have a white center region, while nodes that are floating, such as contacts that are connected to a polysilicon gate, typically have a black center region.

FIG. 1 is a diagram that illustrates a prior-art passive voltage contrast image 100. As shown in FIG. 1, image 100 has a number of dots 110 that include white dots 110W which represent circuit nodes (e.g., contacts) that are connected to ground, and a number of black dots 110B which represent circuit nodes that are floating.

Once a passive voltage contrast image, such as image 100, has been formed, a failure analyst next compares a circuit layout with the image to identify each dot in the image, and the expected state (grounded or floating) of each dot. After each dot has been identified, the actual state (grounded or floating) of each dot as indicated in the image is compared with the expected state as indicated by the circuit layout to determine whether the actual state matches the expected state.

Although passive voltage contrast tests provide a powerful approach to detecting faults, one serious drawback to the approach is that the dots in a passive voltage contrast image are typically examined by hand. As a result, the examination of the dots in the image becomes a tremendously labor intensive project. For example, given a failure location, there could be anywhere from 2 to 50 different nets to examine.

One approach to this problem is to test both a known good die and an unknown die. A failure analyst then compares the passive voltage contrast image from the known good die with the passive voltage contrast image from the unknown die. Thus, rather than identifying each dot in the image and determining whether the dot has the expected value, only the dots in the two images which fail to match need be identified.

Although this approach reduces the time required to identify the dots in a passive voltage contrast image, there is a need for additional approaches.

BRIEF DESCRIPTION OF THE DRAWINGS

As noted, FIGS. 2, 4, 5, and 6 are flow charts illustrating methods according to embodiments of the present invention. The techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

DETAILED DESCRIPTION OF THE INVENTION

Figure 1:
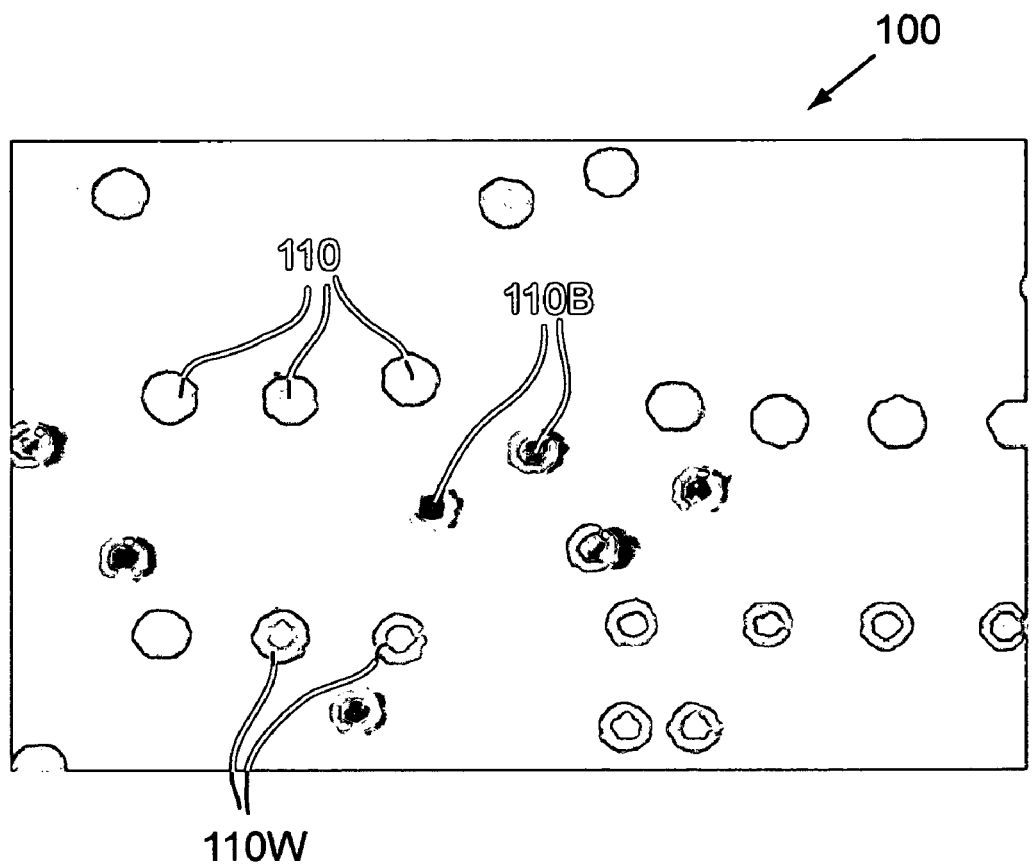
FIG. 1 is a diagram illustrating a prior-art passive voltage contrast image 100.
Figure 2:
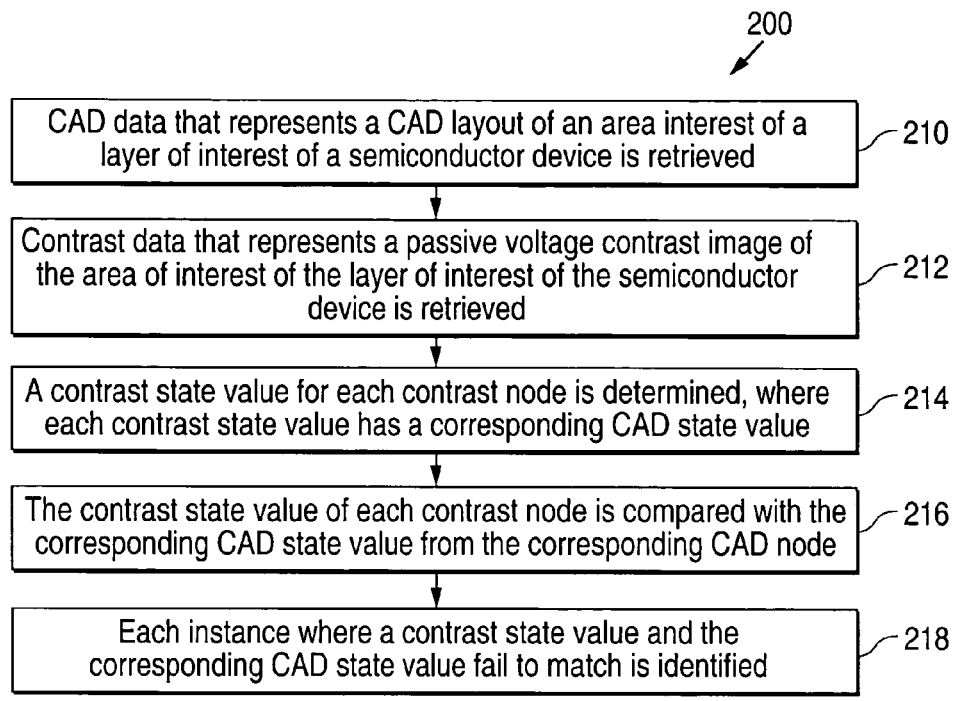
FIG. 2 is a flow chart illustrating an example of a method 200 of testing a semiconductor device in accordance with the present invention.

FIG. 2 is a flow chart that illustrates an example of a method 200 of testing a semiconductor device in accordance with the present invention. As described in greater detail below, the present invention reduces the time required to perform a passive voltage contrast test by digitizing a passive voltage contrast image, and comparing the digitized image to computer aided design (CAD) data that defines the semiconductor device.

As shown in FIG. 2, method 200 begins at 210 where CAD data that represents a CAD layout of an area of interest of a layer of interest of a semiconductor device is retrieved. The fabrication of a semiconductor device, which begins with a substrate, includes the formation of conductive regions in and on the substrate, and layers of interconnect materials over the substrate.

The layers of interconnect material formed over the substrate include layers of metal traces, layers of insulation material that physically support and electrically isolate the metal traces, contacts that electrically connect the structures formed in and on the substrate to the first layer of metal traces, and vias that electrically interconnect the remaining layers of metal traces.

Each layer within the layers of interconnect material can be described by a drawing that shows the precise location of each structure that is present at the layer. For example, a contact layer drawing shows a number of heavily-doped contact regions that are formed in a substrate, a number of polysilicon strips that are formed over the substrate, and a number of contacts that make electrical connections with the contact regions and polysilicon strips.

Figure 3:
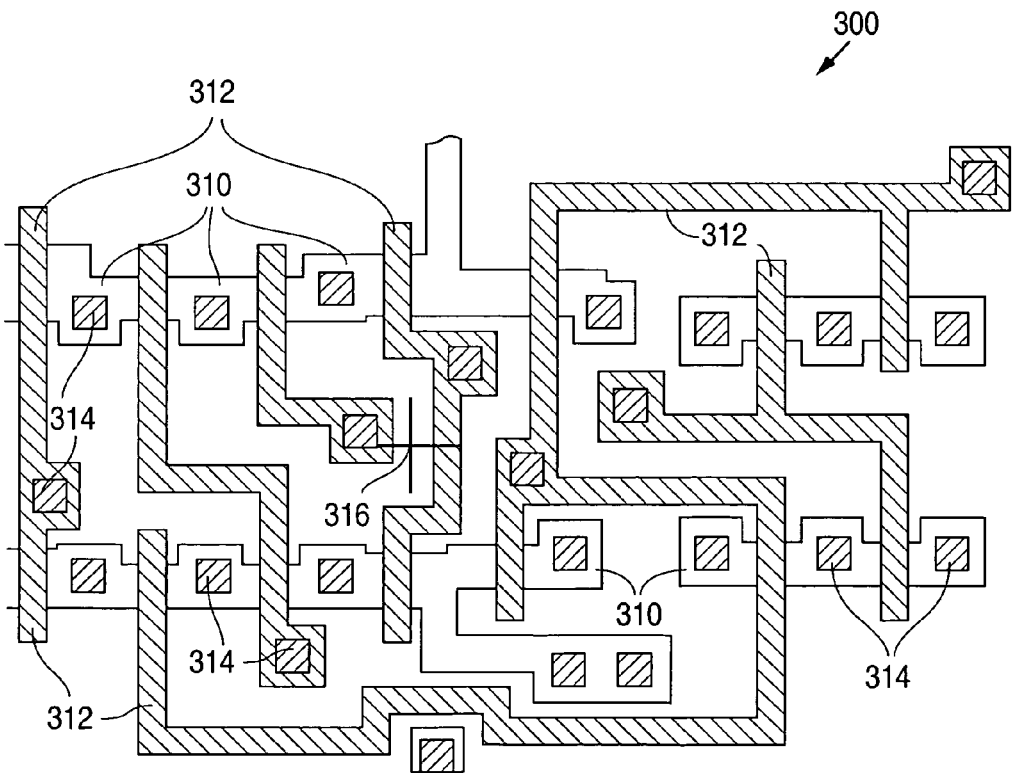
FIG. 3 is a drawing illustrating an example of an area of interest of a contact layer 300 in accordance with the present invention.

FIG. 3 is a drawing that illustrates an example of an area of interest of a contact layer 300 in accordance with the present invention. As shown in FIG. 3, the area of interest of contact layer 300 includes a number of heavily-doped contact regions 310 that are formed in a substrate, a number of polysilicon strips 312 that are formed over the substrate, and a number of contacts 314 that make an electrical connection with regions 310 and strips 312. In addition, the area of interest of contact layer 300 has an origin 316 of a local coordinate system.

Via layer drawings are simpler, typically showing only the vias that are present at that layer, along with the insulation material that isolates the vias and the adjacent layers of metal traces. For example, a via-3 layer drawing shows the isolation material and the vias that interconnect the metal-3 and metal-4 layers. The contacts and vias that are present at a particular layer are referred to as the nodes of that layer.

The drawings that describe a semiconductor device are generated and stored electronically as CAD data using well-known CAD applications running on computers. For an area of interest in a layer of interest, the CAD data includes the nodes (contacts/vias) that are present at the layer. In addition, for each node, the CAD data includes the top surface area of the node (the top surface area of a node varies with the magnification), the x-y position of a point within the top surface area, and a grounded or floating state of the node with respect to a grounded substrate.

For example, with reference to FIG. 3, the CAD data includes the top surface area of each node (contact) 314, the x-y position of each node 314 with respect to the local origin 316, and the state of each node 314 (whether grounded or floating with respect to a grounded substrate).

Figure 4:
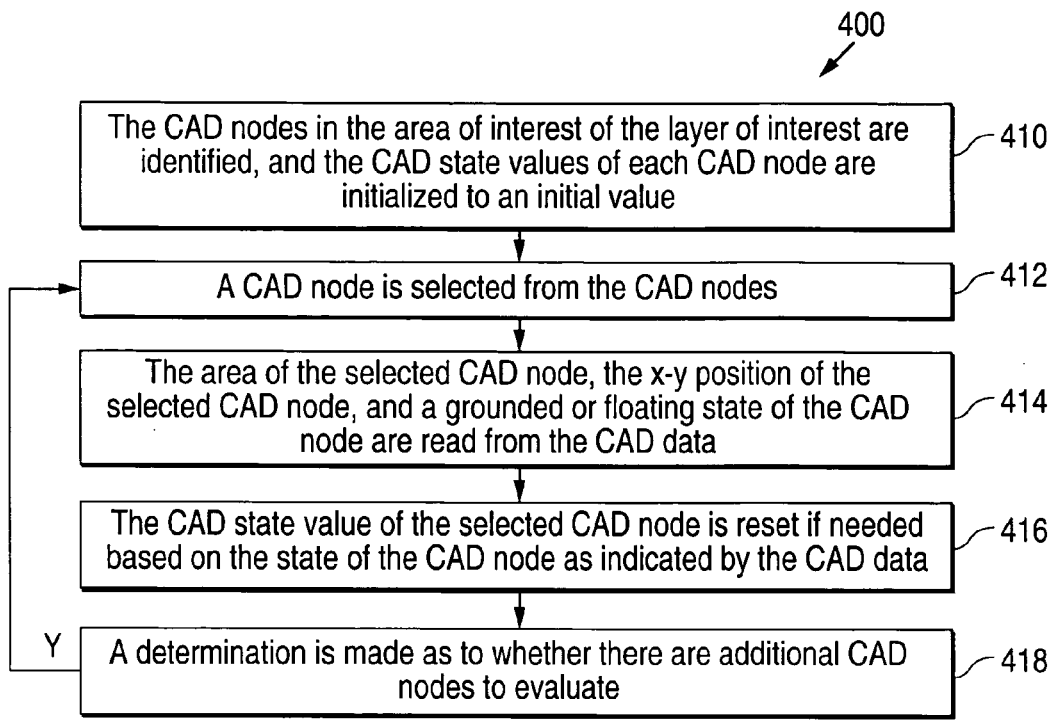
FIG. 4 is a flow chart illustrating an example of a method 400 of retrieving CAD data in accordance with the present invention.

FIG. 4 is a flow chart that illustrates an example of a method 400 of retrieving CAD data in accordance with the present invention. As shown in FIG. 4, method 400 begins in 410 by identifying the CAD nodes in the area of interest of the layer of interest, and initializing the CAD state values of each CAD node to an initial value. In 412, method 400 selects a CAD node from the CAD nodes.

In 414, method 400 reads the area of the selected CAD node, the x-y position of the selected CAD node, and a grounded or floating state of the CAD node from the CAD data. Following this, in 416, method 400 resets the CAD state value for the selected CAD node if needed based on the state of the CAD node as indicated by the CAD data. For example, if each CAD state value is set to dark and the value read from the CAD data indicates that a node is bright, then the CAD state value is reset to bright.

In 418, method 400 makes a determination as to whether there are additional CAD nodes to evaluate. When additional nodes remain to be evaluated, method 400 returns to 412. When no more CAD nodes remain to be evaluated, the CAD data for the area of interest of the layer of interest has been retrieved.

Referring again to FIG. 2, in addition to retrieving CAD data, in 212, method 200 also retrieves contrast data that represents a passive voltage contrast image of the area of interest of the layer of interest of the semiconductor device. The contrast data can be formed, for example, by digitizing a passive voltage contrast image.

The passive voltage contrast image, which shows a number of nodes with different colors that indicate the grounded or floating state of the nodes with respect to a grounded substrate, can be formed in a conventional manner. Thus, since the CAD data and the contrast data cover the same area of interest of the layer of interest, the contrast data has a number of contrast nodes where each contrast node has a corresponding CAD node.

Figure 5:
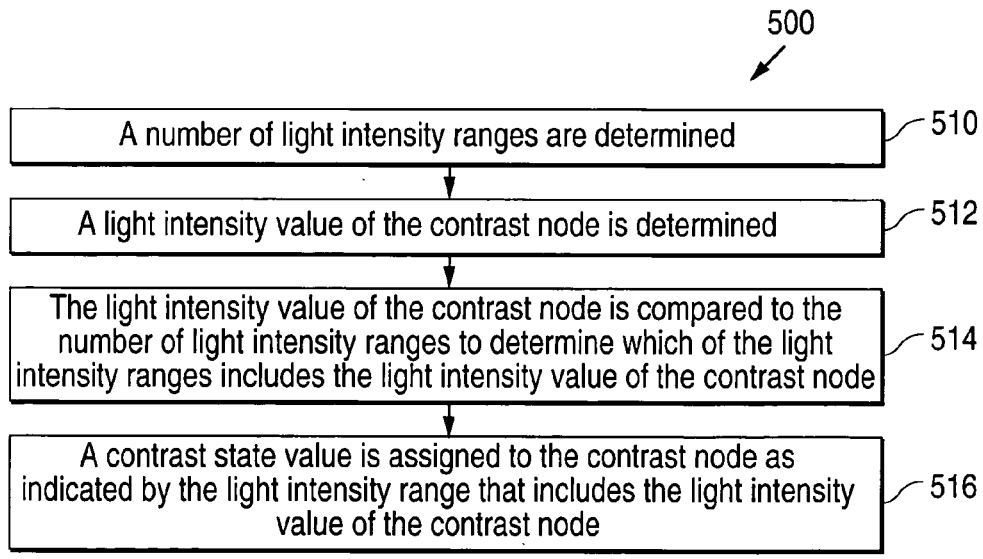
FIG. 5 is a flow chart illustrating a method 500 of determining a contrast state value of a contrast node in accordance with the present invention.

In 214, method 200 determines a contrast state value for each contrast node where each contrast state value has a corresponding CAD state value. FIG. 5 shows a flow chart that illustrates a method 500 of determining a contrast state value of a contrast node in accordance with the present invention.

As shown in FIG. 5, method 500 begins at 510 by determining a number of light intensity ranges. When evaluating a via layer, each node (via) can have one of two values, a bright value and a dark value. In this case the light intensity ranges can include two ranges, a lower range that extends down from a threshold, and an upper range that extends up from the threshold.

However, when evaluating the contact layer, each node (contact) can have one of four values. Nodes which are connected to an n-type polysilicon strip have a first gray color when floating, while nodes which are connected to a p-type polysilicon strip have a second gray color when floating.

In this case, the light intensity ranges can include four ranges, an upper range that represents white, and a first intermediate range that represents the first gray color. The four light intensity ranges can also include second intermediate range that represents the second gray color, and a lower range that represents black.

Figure 6:
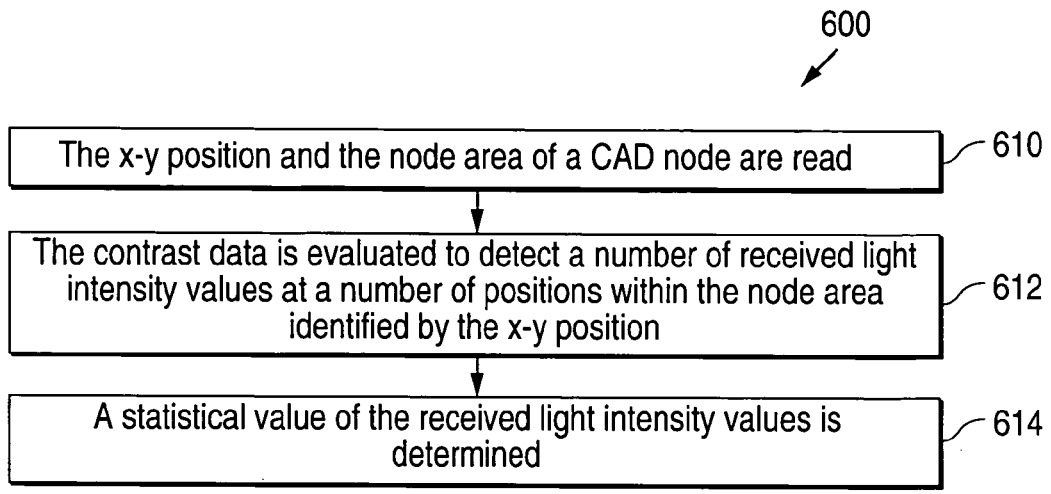
FIG. 6 is a flow chart illustrating an example of a method 600 of determining a light intensity value of the contrast node in accordance with the present invention.

In addition to determining the light intensity ranges, in 512, method 500 determines a light intensity value of the contrast node. FIG. 6 is a flow chart that illustrates an example of a method 600 of determining a light intensity value of the contrast node in accordance with the present invention.

As shown in FIG. 6, method 600 begins at 610 by reading the x-y position and the node area of a CAD node. Following this, method 600 moves to 612 to evaluate the contrast data to detect a number of received light intensity values at a number of positions within the node area identified by the x-y position.

Since the CAD data and the contrast data cover the same area of interest of the layer of interest, the x-y position of a CAD node corresponds with the x-y position of a contrast node. Thus, for example, method 600 can detect 20 light intensity values for a contrast node from the contrast data within the node area identified by the x-y position of a CAD node.

Once a number of received light intensity values have been received, method 600 moves to 614 to determine a statistical value of the received light intensity values. The statistical value, which represents the light intensity value of the contrast node, can be, for example, the average or median value of the number of received light intensity values.

Referring again to FIG. 5, after the light intensity value of the contrast node has been determined, method 500 moves to 514 to compare the light intensity value of the contrast node to the number of light intensity ranges to determine which of the light intensity ranges includes the light intensity value of the contrast node. After this, in 516, a contrast state value is assigned to the contrast node as indicated by the light intensity range that includes the light intensity value of the contrast node.

With reference again to FIG. 2, after a contrast state value for each contrast node has been determined in 214, method 200 moves to 216 to compare the contrast state value of each contrast node with the corresponding CAD state value from the corresponding CAD node. In addition, in 218, method 200 identifies each instance, which is considered to be a defect, where a contrast state value and the corresponding CAD state value fail to match.

If no defect is found, i.e., where each contrast state value and the corresponding CAD state value match, the next layer in the area of interest is examined. The layers of material are sequentially examined, beginning with the top layer. For example, in a semiconductor device with three metal layers, the third metal layer is removed so that the via-2 layer can be examined in accordance with the present invention.

If no errors are found in the via-2 layer, then the via-2 layer and the metal-2 layer are removed so that the via-1 layer can be examined in accordance with the present invention. If no errors are found in the via-1 layer, then the via-1 layer and the metal-1 layer are removed so that the contact layer can be examined in accordance with the present invention.

Thus, the present invention provides a method of testing a semiconductor device using a passive voltage contrast test that reduces the amount of time required to compare the grounded or floating state of a node as shown in a passive voltage contrast image with the state that is expected for the node.

Figure 7:
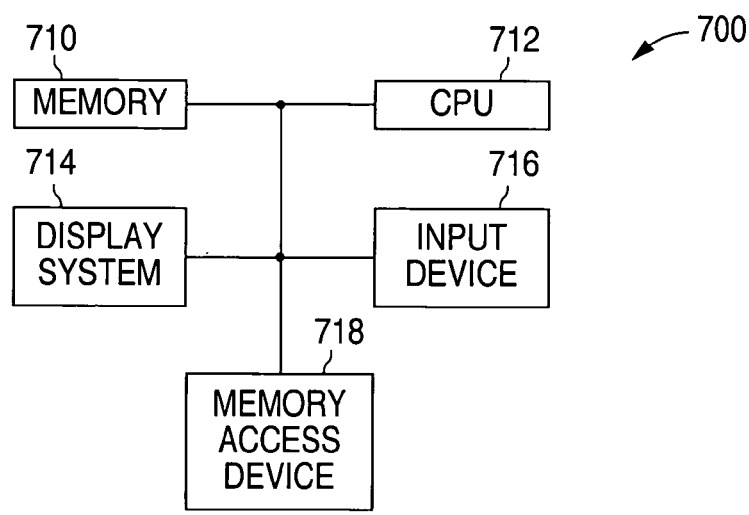
FIG. 7 is a block diagram illustrating an example of a computer 700 in accordance with the present invention.

FIG. 7 shows a block diagram that illustrates an example of a computer 700 in accordance with the present invention. Computer 700, which can be implemented with, for example, a Pentium4 3.4 GHz or comparable machine, can be used to execute a sequence of instructions that implements methods 200, 400, 500, and 600 of the present invention.

As shown in FIG. 7, computer 700 includes a memory 710 and a central processing unit (CPU) 712 that is connected to memory 710. Memory 710 stores data, an operating system, and a set of program instructions. The operating system can be implemented with, for example, the Linux operating system, although other operating systems can alternately be used. The program instructions can be written in, for example, C++ although other languages can alternately be used.

CPU 712, which can be implemented with, for example, a 32-bit processor, operates on the data in response to the program instructions. Although only one processor is described, the present invention can be implemented with multiple processors in parallel to increase the capacity to process large amounts of data.

In addition, computer 700 can include a display system 714 that is connected to CPU 712. Display system 714, which can be remotely located, allows images to be displayed to the user which are necessary for the user to interact with the program. Computer 700 also includes a user-input system 716 which is connected to CPU 712. Input system 716, which can be remotely located, allows the user to interact with the program.

Further, computer 700 includes a memory access device 718, such as a disk drive or a networking card, which is connected to memory 710 and CPU 712. Memory access device 718 allows the processed data from memory 710 or CPU 712 to be transferred to a computer-readable medium or a networked computer. In addition, device 718 allows the program instructions to be transferred to memory 710 from the computer-readable medium or networked computer.

In an alternative embodiment, hardware circuitry may be used in place of or in combination with software instructions to implement an embodiment of the present invention. As a result, the present invention is not limited to any specific combination of hardware circuitry and software.

Embodiments of the present invention may be provided as a computer program product, or software, that may include an article of manufacture on a machine accessible or machine readable medium having instructions. The instructions on the machine accessible or machine readable medium may be used to program a computer system or other electronic device.

The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment.

The terms "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of testing a semiconductor device, the method comprising:

retrieving CAD data that represents a layout of an area of interest of a layer of interest of the semiconductor device, the CAD data defining a plurality of CAD nodes, each CAD node having a plurality of CAD values, the plurality of CAD values including a CAD state value;

retrieving contrast data that represents a passive voltage contrast image of the area of interest of the layer of interest of the semiconductor device, the contrast data having a plurality of contrast nodes, each contrast node having a corresponding CAD node;

determining a contrast state value for each contrast node, each contrast state value having a corresponding CAD state value;

comparing the contrast state value of each contrast node with the corresponding CAD state value from the corresponding CAD node; and identifying each instance where a contrast state value and the corresponding CAD state value fail to match.

2. The method of claim 1 wherein determining a contrast state value of a contrast node comprises:

determining a plurality of light intensity ranges;

determining a light intensity value of the contrast node;

comparing the light intensity value of the contrast node to the number of light intensity ranges to determine which of the light intensity ranges includes the light intensity value of the contrast node; and assigning a contrast state value to the contrast node as indicated by the light intensity range that includes the light intensity value.

3. The method of claim 2 wherein the light intensity ranges include a dark range that includes light intensity values that are interpreted to be dark, and a bright range that includes light intensity values that are interpreted to be bright.

4. The method of claim 2 wherein the light intensity ranges include a medium dark range that includes light intensity values that are interpreted to be lighter than dark, and a medium bright range that includes light intensity values that are interpreted to be darker than bright.

5. The method of claim 1 wherein the contrast data is formed by digitizing the passive voltage contrast image.

6. The method of claim 2 wherein the plurality of values of each CAD node includes a node area and an x-y position that identifies a point in the node area.

7. The method of claim 6 wherein determining a light intensity value of the contrast node includes:
reading the x-y position and the node area of a CAD node;
evaluating the contrast data to detect a plurality of received light intensity values at a plurality of positions within the node area identified by the x-y position; and
determining a statistical value of the received light intensity values, the statistical value representing the light intensity value of the contrast node.

8. The method of claim 7 wherein the statistical value is an average value.

9. The method of claim 7 wherein the statistical value is an median value.

10. The method of claim 1 wherein retrieving CAD data includes:
identifying a plurality of CAD nodes in the area of interest in the layer of interest, and initializing the CAD state values of each CAD node to an initial value;
selecting a CAD node from the plurality of CAD nodes to form a selected CAD node;
reading an area of the selected CAD node, an x-y position of the selected CAD node, and a state of the selected CAD node;
resetting the CAD state value if needed based on the state of the selected CAD node; and
determining whether there are additional CAD nodes to evaluate.

11. The method of claim 10 wherein the initial value represents black.

12. The method of claim 10 wherein the initial value represents bright.

13. The method of claim 1 wherein when each contrast state value and the corresponding CAD state value match, the area of interest of a lower layer is evaluated.

14. A non-transitory computer-readable medium having stored thereon sequences of instructions, the sequences of instructions including instructions which, when executed by a processor, causes the processor to perform:
retrieving CAD data that represents a layout of an area of interest of a layer of interest of a semiconductor device, the CAD data defining a plurality of CAD nodes, each CAD node having a plurality of CAD values, the plurality of CAD values including a CAD state value;
retrieving contrast data that represents a passive voltage contrast image of the area of interest of the layer of interest of the semiconductor device, the contrast data having a plurality of contrast nodes, each contrast node having a corresponding CAD node;
determining a contrast state value for each contrast node, each contrast state value having a corresponding CAD state value;
comparing the contrast state value of each contrast node with the corresponding CAD state value from the corresponding CAD node; and
identifying each instance where a contrast state value and the corresponding CAD state value fail to match.

15. The non-transitory computer-readable medium of claim 14 wherein determining a contrast state value of a contrast node comprises:
determining a plurality of light intensity ranges;
determining a light intensity value of the contrast node;
comparing the light intensity value of the contrast node to the number of light intensity ranges to determine which of the light intensity ranges includes the light intensity value of the contrast node; and
assigning a contrast state value to the contrast node as indicated by the light intensity range that includes the light intensity value.

16. The non-transitory computer-readable medium of claim 14 wherein the plurality of values of each CAD node includes a node area and an x-y position that identifies a point in the node area.

17. The non-transitory computer-readable medium of claim 16 wherein determining a light intensity value of the contrast node includes:
reading the x-y position and the node area of a CAD node;
evaluating the contrast data to detect a plurality of received light intensity values at a plurality of positions within the node area identified by the x-y position; and
determining a statistical value of the received light intensity values, the statistical value representing the light intensity value of the contrast node.

* * * * *